United States Patent [19]

Nogle et al.

[11] Patent Number: 5,623,437
[45] Date of Patent: Apr. 22, 1997

[54] CIRCUIT HAVING COMBINED LEVEL CONVERSION AND LOGIC FUNCTION

[75] Inventors: Scott G. Nogle; Alan S. Roth, both of Austin, Tex.

[73] Assignee: Motorola, Inc., Schaumburg, Ill.

[21] Appl. No.: 532,291

[22] Filed: Sep. 22, 1995

[51] Int. Cl.$^6$ .................................................. G11C 7/00
[52] U.S. Cl. ................... 365/49; 365/189.07; 365/225.6
[58] Field of Search .................... 365/49, 177, 189.07, 365/225.6

[56] References Cited

U.S. PATENT DOCUMENTS

| | | | |
|---|---|---|---|
| 4,907,189 | 3/1990 | Branson et al. | 364/900 |
| 5,218,567 | 6/1993 | Suzuki | 365/177 |
| 5,289,414 | 2/1994 | Hatsuda | 365/189.07 |
| 5,301,148 | 4/1994 | Okajima | 365/177 |
| 5,473,561 | 12/1995 | Jones | 365/49 |

Primary Examiner—David C. Nelms
Assistant Examiner—Son Mai
Attorney, Agent, or Firm—Daniel D. Hill

[57] ABSTRACT

A circuit having a combined level conversion and logic function (37, 90, 101, 102, and 103) receives a differential CMOS level input signal, and an input signal having a relatively small logic swing, performs a logic operation, and provides a single-ended CMOS output signal. The circuit (37) includes a CMOS switching portion (71) and a small signal switching portion (75) connected to provide a CMOS output signal that is the result of a logical operation of the input signals. The circuits (37, 90, 101, 102, and 103), eliminate the need for a separate level converter, reducing at least a gate delay, and insuring faster generation of the output signal. Also, the use of the circuit (37) having a combined level conversion and logic function allows the cache TAG (20) to provide read data at the same time that a match signal is generated.

19 Claims, 3 Drawing Sheets

CIRCUIT HAVING COMBINED LEVEL CONVERSION AND LOGIC FUNCTION

CROSS-REFERENCE TO RELATED, COPENDING APPLICATION

A related, copending application, entitled "BICMOS CACHE TAG COMPARATOR HAVING REDUNDANCY AND SEPARATE READ AND COMPARE PATHS", by Taisheng Feng, having Ser. No. 08/264,090, was filed on Jun. 21, 1994, and assigned to the assignee hereof.

FIELD OF THE INVENTION

This invention relates generally to circuits, and more particularly, to a circuit having a combined level conversion and logic function.

BACKGROUND OF THE INVENTION

A cache memory is a relatively small, high speed memory that is used to increase the speed of a data processing system. The access time of the cache memory is close to the central processing unit (CPU) logic propagation delay. The cache memory stores frequently used instructions or data to reduce the number of accesses between the CPU and a relatively slower main memory, thus improving system performance.

A cache TAG is a necessary part of the cache memory. The cache TAG receives an address that is provided by the processor and determines if the requested instructions or data are present in the cache memory. Like the cache memory, the cache TAG has an array of conventional static random access memory (SRAM) cells. When data is written into the cache memory, the higher order bits of the address of the data are stored in the cache TAG. When in a read/compare mode, a comparator in the cache TAG compares a processor generated address to the TAG address. If the TAG address and the processor generated address are the same, a cache "hit" occurs, and a match signal of a predetermined logic state is provided by the cache TAG, indicating that the requested data is located in the cache memory. If the processor generated address and the TAG address are not the same, a cache "miss" occurs, and a match signal of an opposite logic state is provided by the cache TAG, indicating to the processor that the requested data is not located in the cache memory.

It is important for the match signal to be generated as quickly as possible after the cache TAG receives the data to be compared. In some prior art cache TAGs, the read data and the match signal share the same data path, which results in increased gate delay before the match signal can be provided to the processor. Also, the processor generated address and the TAG address may be at different logic levels, requiring either the processor generated address or the TAG address to first be level converted before a comparison can be accomplished, resulting in increased gate delay when generating the match signal. In addition, in the case of a hit, prior art cache TAGs that share a common data path cannot provide read data for the cache TAG at the same time that a match signal is provided.

DESCRIPTION OF A PREFERRED EMBODIMENT

Generally, the present invention provides a circuit having a combined level conversion and logic function. In one embodiment a combined level converter/logic circuit is used in a cache TAG to compare two signals having different logic levels to generate a match signal. The combined level converter/logic circuit receives a differential CMOS (complementary metal-oxide semiconductor) level input signal, and an input signal having a relatively small differential signal swing, performs a logical operation, and provides a single-ended CMOS output signal. By using the combined level converter/logic circuit in an integrated circuit, the need for a separate level converter is eliminated, reducing at least a gate delay, and insuring faster generation of the output logic signal.

The cache TAG having an integrated, or combined, level converter/comparator circuit stores a plurality of TAG addresses, and in a compare mode, compares a stored TAG address to an input address from a data processor. The combined level converter/logic circuit receives a differential CMOS level input signal corresponding to a bit of the input address, and a differential ECL (emitter-coupled logic) type data signal corresponding to a bit of the stored TAG address, performs an exclusive NOR operation, and provides a single-ended CMOS level match signal. By using the combined level converter/logic circuit, the need for a separate level converter is eliminated, reducing at least a gate delay, and insuring faster generation of the match signal. Also, the use of the combined level converter/logic circuit allows the cache TAG to provide read data (TAG address) at the same time that the match signal is generated.

Figure 1:
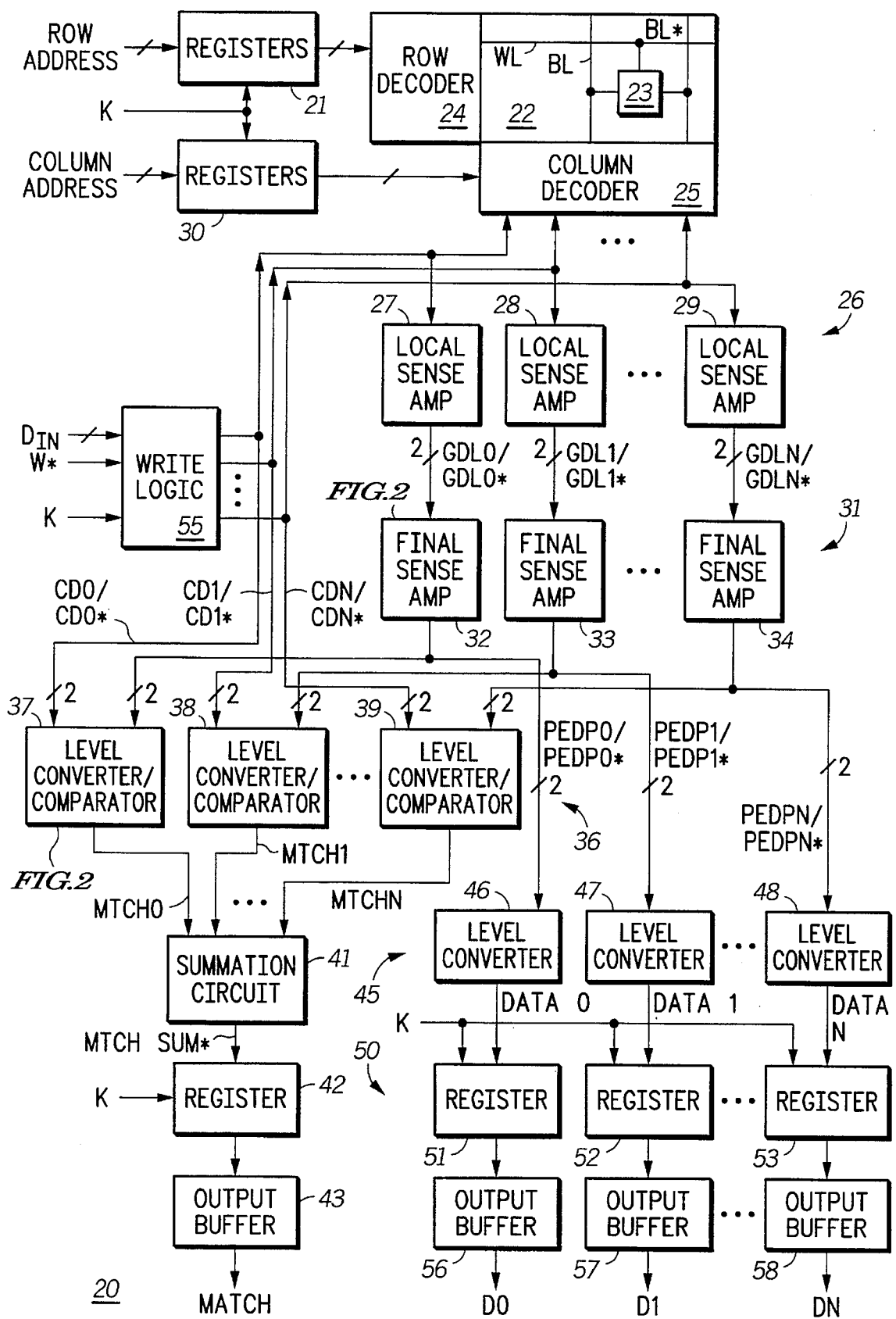
FIG. 1 illustrates in block diagram form, a cache TAG in accordance with the present invention.

The present invention can be more fully described with reference to FIG. 1–6. FIG. 1 illustrates in block diagram form, a cache TAG 20 in accordance with the present invention. Cache TAG 20 includes TAG array 22, row decoder 24, column decoder 25, registers 21 and 30, local sense amplifiers 26, final sense amplifiers 31, combined level converters/logic circuits 36, summation circuit 41, match register 42, match output buffer 43, level converters 45, and output data registers 50, output buffers 56, 57, and 58, and write logic 55.

TAG array 22 includes a plurality of conventional static random access memory (SRAM) cells organized in intersecting rows and columns. Local sense amplifiers 26 include local sense amplifiers 27, 28, and 29. Final sense amplifiers 31 include final sense amplifiers 32, 33, and 34. Combined level converters/logic circuits 36 include combined level converters/logic circuits 37, 38, and 39. Combined level converter/comparator 37 is illustrated in more detail in FIG. 2. Level converters 45 include level converters 46, 47, and 48. Output data registers 50 include registers 51, 52, and 53.

A word line and the memory cells coupled to the word line comprise a row of memory cells. A bit line pair and the memory cells coupled to the bit line pair comprise a column of memory cells. A memory cell is located at each intersection of the word lines and the bit line pairs. A representative memory cell 23 is illustrated connected to a bit line pair labeled "BL" and "BL*", and to a word line labeled "WL". Note that an asterisk (*) after a signal name indicates that the signal is a logical complement of a signal having the same name but lacking the asterisk (*). The memory cells of TAG array 22 are addressable through row decoding and column decoding, and each memory cell has a unique address at an intersection of a row and a column. In the illustrated embodiment, the word lines are coupled to row decoder 24, and the bit line pairs are coupled to column decoder 25. Cache TAG 20 may also include redundant elements to replace defective elements of TAG array 22 which are not illustrated in FIG. 1. Using redundancy improves yield by allowing a TAG array having a few defective elements to be repaired, thus lowering manufacturing costs.

Row decoder 24 receives a plurality of row address signals labeled "ROW ADDRESS". Column decoder 25 receives a plurality of column address signals labeled "COLUMN ADDRESS". The row and column address signals are provided by a data processor (not shown) and comprise lower order address bits of a processor generated address. The row and column address signals are registered by registers 21 and 30, respectively, and provided to the row and column decoders in response to a clock signal labeled "K". In response to receiving the plurality of address signals, row decoder 24 selects a word line and column decoder 25 couples a bit line pair to input terminals of one of the local sense amplifiers 27, 28, and 29. A TAG address bit is provided by the bit line pairs to each of local sense amplifiers 27, 28, and 29. Output terminals of the local sense amplifiers 27, 28, and 29 are coupled to corresponding input terminals of final sense amplifiers 32, 33, and 34 via differential global data lines for providing differential data signals labeled "GDL0/GDL0*", "GDL1/GDL1*", and "GDLN/GDLN*", respectively.

Final sense amplifier 32 has output terminals connected to first input terminals of combined level converter/comparator 37 and to input terminals of level converter 46 for providing differential data signals labeled "PEDP0/PEDP0*". Final sense amplifier 33 has output terminals connected to input terminals of combined level converter/comparator 38 and to input terminals of level converter 47 for providing differential data signals labeled "PEDP1/PEDP1*". Final sense amplifier 34 has output terminals connected to input terminals of combined level converter/comparator 39 and to input terminals of level converter 48 for providing differential data signals labeled "PEDPN/PEDPN*". Differential data signals PEDP0/PEDP0*, PEDP1/PEDP1*, and PEDPN/PEDPN* have relatively small signal swings, comparable to ECL (emitter-coupled logic) levels, of about 1.5 volts with a power supply voltage of about 3.3 volts, where a logic high voltage is about 2.3 volts and a logic low voltage is about 0.8 volts.

Write logic 55 represents circuitry required for writing data to TAG array 22, and to combined level converters/logic circuits 36, includes registers, input buffers, and write drivers. Write logic 55 has a plurality of input terminals for receiving a plurality of input data signals labeled "$D_{IN}$", an input terminal for receiving clock signal K, an input terminal for receiving a write enable signal labeled "W*", and a plurality of output terminals for providing differential input signals labeled "CD0/CD0*", "CD1/CD1*", and "CDN/CDN*". The plurality of output terminals are connected to column decoder 25, and to second input terminals of combined level converters/comparators 37, 38, and 39. Differential data signals CD0/CD0*, CD1/CD1*, and CDN/CDN* are CMOS level signals having essentially rail-to-rail logic swings of about 3.0 volts.

Combined level converter/comparator 37 has an output terminal for providing a match signal labeled "MTCH 0", combined level converter/comparator 38 has an output terminal for providing a match signal labeled "MTCH 1", and combined level converter/comparator 39 has an output terminal for providing a match signal labeled "MTCH N". Summation circuit 41 has a plurality of input terminals for receiving the match signals from combined level converters/comparators 36, and an output signal for providing a match signal labeled "MTCH SUM*". Match register 42 has an input terminal connected to the output terminal of summation circuit 41, an input terminal for receiving clock signal K, and an output terminal. Match output buffer 43 has an input terminal connected to the output terminal of match register 42, and an output terminal for providing a buffered match signal labeled "MATCH".

Level converter 46 has an output terminal for providing a data signal labeled "DATA 0" to an input terminal of data register 51, level converter 47 has an output terminal for providing a data signal labeled "DATA 1" to an input terminal of data register 52, and level converter 48 has an output terminal for providing a data signal labeled "DATA N". Data registers 51, 52, and 53 each have an output terminal connected to a corresponding data output buffer 56, 57, and 58, respectively, for providing data signals labeled "D0", "D1", and "DN" in response to clock signal K. Registers 21, 30, 42, and 50 are conventional temporary storage elements.

In a preferred embodiment, cache TAG 20 is a synchronous 64K×18 BICMOS SRAM. TAG array 22 is organized to store up to an 18 bit TAG address. Note that only three output data paths are shown for the purposes of clarity and simplicity. However, in other embodiments, cache TAG 20 may have a different data organization, or word width.

In a write mode of cache TAG 20 write enable signal W* is provided as a logic low, and write logic 55 receives the plurality of input data signals $D_{IN}$. An address comprised of lower order row and column address signals from a data processor (not shown) are provided to row decoder 24 and column decoder 25, respectively, to select a location in TAG array 22 for storing the data (TAG address). Input data signals DIN are written to the selected location in TAG array 22 via column decoders 25. Note that in another embodiment, at the same time that the data is being written to TAG array 22, a valid bit (not shown) may also be set to indicate that the selected location in TAG array 22 contains valid data.

In a read/compare mode, cache TAG 20 receives an address comprised of lower order row and column address signals from the data processor. In response to receiving the address signals, TAG array 22 provides an 18 bit word to 18 local sense amplifiers represented by local sense amplifiers 26. The 18 bit word is the most significant bits of a TAG address for accessing a cache memory (not shown). The valid bit is set as a prerequisite to obtaining a valid cache hit. Each bit of the 18 bit word is provided to one of local sense amplifiers 26, such as local sense amplifiers 27, 28, and 29. Local sense amplifiers 27, 28, and 29 sense and amplify the relatively small differential signals provided to each bit line pair of TAG array 22 and provides the corresponding differential data signals GDL0/GDL0*, GDL1/GDL1*, and GDLN/GDLN* to the global data lines to be transmitted to final sense amplifiers 31. Final sense amplifiers 31 further amplifies the data signals and provides differential data signals PEDP0/PEDP0*, PEDP1/PEDP1*, and PEDPN/PEDPN* to both combined level converters/logic circuits 36 and to level converters 45.

At about the same time that the lower order row and column address signals are being provided to TAG array 22, input data signals DIN (input address from the processor)

are provided to write logic 55. The differential input signals CD0/CD0*, CD1/CD1*, and CDN/CDN* corresponding to the plurality of input data signals $D_{IN}$ are provided to combined level converters/logic circuits 36 to be compared to differential data signals PEDP0/PEDP0*, PEDP1/PEDP1*, and PEDPN/PEDPN* and a match signal is provided by each of the combined level converters/comparators to summation circuit 41. For example, combined level converter/comparator 37 compares CD0/CD0* to PEDP0/PEDP0* and if the logic states of CD0/CD0* and PEDP0/PEDP0* are the same, combined level converter/comparator 37 provides a logic high match signal MTCH 0 to summation circuit 41. Likewise, combined level converter/comparator 38 compares CD1/CD1* to PEDP1/PEDP1* to generate match signal MTCH 1, and combined level converter/comparator 39 compares CDN/CDN* to PEDPN/PEDPN* to generate match signal MTCH N. If all of the match signals generated by combined level converters/logic circuits 36 are a logic high, summation circuit 41 provides a logic low match signal MTCH SUM* to match register 42, indicating a cache "hit". If all of the match signals are not a logic high, match signal MTCH SUM* is provided as a logic high, indicating that a cache "miss" occurred, indicating that the requested information is not located in the cache memory. When a cache miss occurs the main memory is accessed to retrieve the required data or instructions.

Match signal MTCH SUM* is provided to match register 42. In response to clock signal K, match register 42 provides the match signal to output buffer 43, which outputs the buffered match signal MATCH having a logic state corresponding to match signal MTCH SUM*.

While buffered match signal MATCH is being generated, differential data signals PEDP0/PEDP0*, PEDP1/PEDP1*, and PEDPN/PEDPN* are also being provided to level converters 45. Level converters 45 level converts these differential ECL type signals to single-ended rail-to-rail CMOS level signals DATA 0, DATA 1, and DATA N. Data signal DATA 0, DATA 1, and DATA N are temporarily stored in data registers 50, and are provided to output buffers 56, 57, and 58 in response to clock signal K.

When logic low match signal MATCH is provided to the data processor, indicating that the requested data is not located in cache memory, new data is loaded into the cache memory from the main memory. When the new data is loaded into cache memory, the most significant bits of the addresses associated with the new data are written into, and stored, in TAG array 22 as described above.

Note that while combined level converter/comparator 37 is illustrated in FIG. 1 in a cache memory, combined level converter/comparator 37 may be used in any type of integrated circuit requiring a level conversion and a logical operation of two signals. Also, additional embodiments are illustrated later in FIGS. 3–6.

Figure 2:
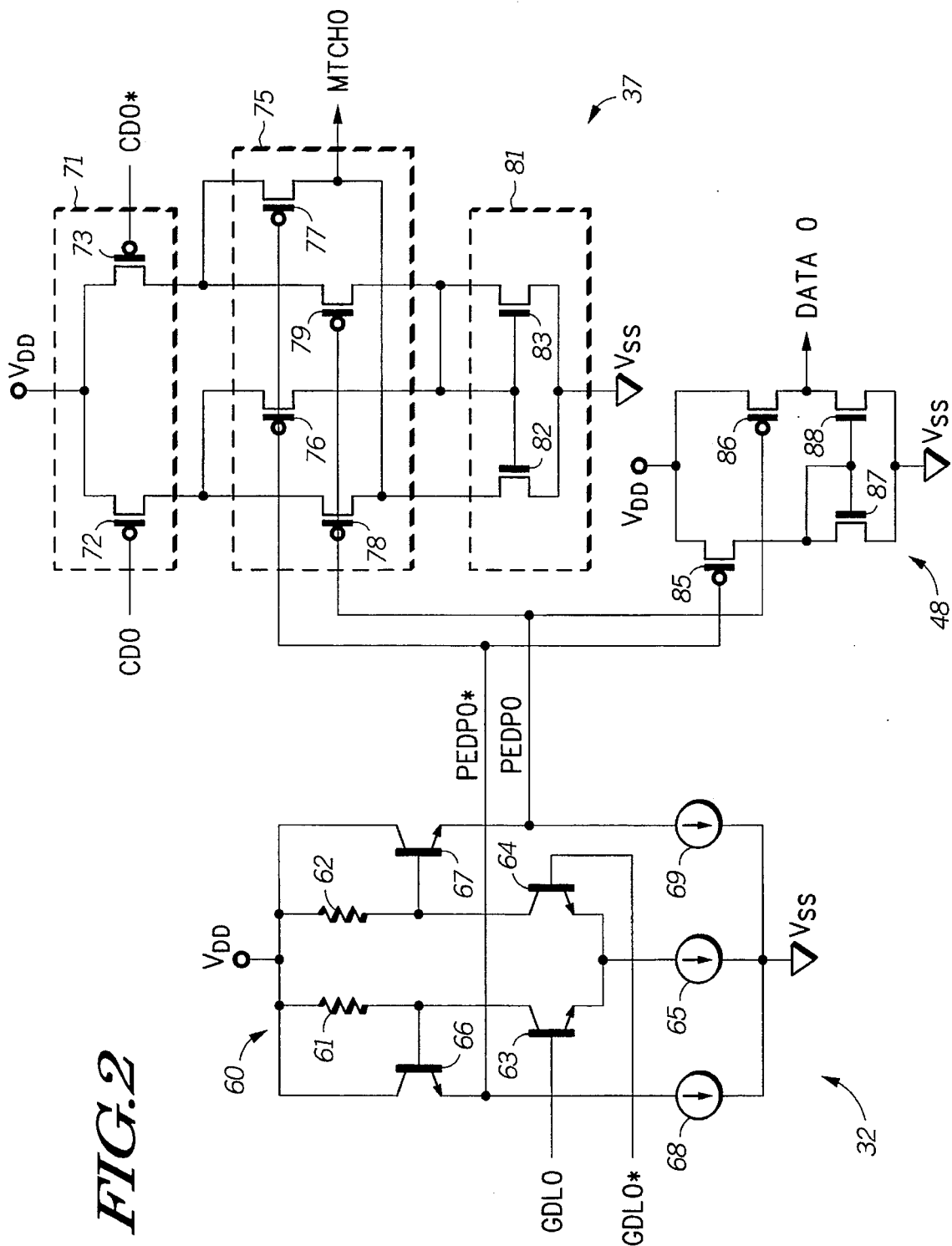
FIG. 2 illustrates in schematic diagram form, a portion of the cache TAG of FIG. 1.

FIG. 2 illustrates in schematic diagram form, final sense amplifier 32, combined level converter/comparator 37, and level converter 48 of cache TAG 20 of FIG. 1. Final sense amplifier 32 includes differential amplifier 60, NPN bipolar emitter-follower transistors 66 and 67 and current sources 68 and 69. Differential amplifier 60 includes resistors 61 and 62, NPN bipolar transistors 63 and 64, and current source 65. Combined level converter/comparator 37 includes CMOS switch portion 71, small signal switch portion 75, and current mirror 81. CMOS switch portion 71 includes P-channel transistors 72 and 73. Small signal switch portion 75 includes P-channel transistors 76, 77, 78, and 79. Current mirror 81 includes N-channel transistors 82 and 83. Level converter 48 includes P-channel transistors 85 and 86, and N-channel transistors 87 and 88.

In final sense amplifier 32, resistor 61 has a first terminal connected to a power supply voltage terminal labeled "$V_{DD}$", and a second terminal. Resistor 62 has a first terminal connected to $V_{DD}$, and a second terminal. NPN transistor 63 has a collector connected to the second terminal of resistor 61, a base for receiving a data signal labeled "GDL0", and an emitter. NPN transistor 64 has a collector connected to the second terminal of resistor 62, a base for receiving a data signal labeled "GDL0*", and an emitter connected to the emitter of NPN transistor 63. Current source 65 has a first terminal connected to the emitters of NPN transistors 63 and 64, and a second terminal connected to a power supply voltage terminal labeled "$V_{SS}$". Emitter-follower transistor 66 has a collector connected to $V_{DD}$, a base connected to the second terminal of resistor 61, and an emitter for providing a data signal labeled "PEDP0*". Current source 68 has a first terminal connected to the emitter of emitter-follower transistor 66, and a second terminal connected to $V_{SS}$. Emitter-follower transistor 67 has a collector connected to $V_{DD}$, a base connected to the second terminal of resistor 62, and an emitter for providing a data signal labeled "PEDP0". Current source 69 has a first terminal connected to the emitter of emitter-follower transistor 67, and a second terminal connected to $V_{SS}$. In combined level converter/comparator 37, P-channel transistor 72 has a source connected to $V_{DD}$, a gate for receiving an input signal labeled "CD0", and a drain. P-channel transistor 73 has a source connected to $V_{DD}$, a gate for receiving an input signal labeled "CD0*", and a drain. P-channel transistor 76 has a source connected to the drain of P-channel transistor 72, a gate connected to the emitter of emitter-follower transistor 66 for receiving data signal PEDP0*, and a drain. P-channel transistor 78 has a source connected to the drain of P-channel transistor 72, a gate connected to the emitter of emitter-follower transistor 67, and a drain. N-channel transistor 82 has a drain connected to the drain of P-channel transistor 78, a gate connected to the drain of P-channel transistor 76, and a source connected to $V_{SS}$. P-channel transistor 77 has a source connected to the drain of P-channel transistor 73, a gate connected to the gate of P-channel 76, and a drain for providing match signal MTCH0. P-channel transistor 79 has a source connected to the drain of P-channel transistor 73, a gate connected to the gate of P-channel transistor 78, and a drain connected to the drain of P-channel transistor 76. N-channel transistor 83 has a drain and a gate connected to the drain of P-channel transistor 79, and a source connected to $V_{SS}$.

In level converter 48, P-channel transistor 85 has a source connected to $V_{DD}$, a gate connected to the emitter of emitter-follower transistor 66, and a drain. N-channel transistor 87 has a gate and a drain connected to the drain of P-channel transistor 85, and a source connected to $V_{SS}$. P-channel transistor 86 has a source connected to $V_{DD}$, a gate connected to the emitter of emitter-follower transistor 67, and a drain for providing data signal DATA 0. N-channel transistor 88 has a drain connected to the drain of P-channel transistor 86, a gate connected to the gate and drain of N-channel transistor 87, and a source connected to $V_{SS}$.

Final sense amplifier 32 is a conventional differential amplifier circuit having emitter-follower output transistors. Current sources 65, 68, and 69 may be N-channel transistors biased to provide relatively constant current sources. Final sense amplifier 32 receives differential data signals GDL0 and GDL0*, and in response, provides differential data signals PEDP0 and PEDP0*. Differential data signals PEDP0 and PEDP0* are provided to both combined level converter/comparator 37 and to level converter 48. Level converter 48 is a conventional level converter circuit for receiving the relatively small signal differential data signals PEDP0 and PEDP0*, and providing single-ended, substantially CMOS level, data signal DATA 0.

Combined level converter/comparator 37 receives CMOS level differential input signals CD0 and CD0* and small signal differential data signals PEDP0 and PEDP0*. Combined level converter/comparator 37 performs an exclusive NOR logic operation, and provides a CMOS level match signal MTCH0 as a result. If differential input signals CD0 and CD0* are a logic high and a logic low, respectively, and differential data signals PEDP0 and PEDP0* are a logic high and a logic low, respectively, then P-channel transistors 73, 76, and 77 are conductive, or "on", and P-channel transistors 72, 78, and 79 are substantially non-conductive, or "off". The substantially non-conductive P-channel transistors 72 and 79 cause N-channel transistors 82 and 83 to also be substantially non-conductive. Therefore, the conductive P-channel transistors 73 and 77 cause match signal MTCH0 to be pulled up to a logic high voltage equal to approximately $V_{DD}$, indicating that differential input signals CD0 and CD0* are the same logic state as differential data signals PEDP0 and PEDP0*.

If differential input signals CD0 and CD0* are a logic low and a logic high, respectively, and differential data signals PEDP0 and PEDP0* are a logic low and a logic high, respectively, then P-channel transistors 72, 78, and 79 are conductive, and P-channel transistors 73, 76, and 77 are substantially non-conductive. The non-conductive P-channel transistors 73, 76, and 77 causes N-channel transistors 82 and 83 to be substantially non-conductive. Therefore, the conductive P-channel transistors 72 and 77 cause match signal MTCH0 to be pulled up to a logic high voltage equal to approximately $V_{DD}$, indicating that differential input signals CD0 and CD0* are the same logic state as differential data signals PEDP0 and PEDP0*.

However, if differential input signals CD0 and CD0* are a logic low and a logic high, respectively, and differential data signals PEDP0 and PEDP0* are a logic high and a logic low, respectively, then P-channel transistors 72, 76, and 77 are conductive, and P-channel transistors 73, 78, and 79 are substantially non-conductive. A conductive path through P-channel transistors 72 and 76 causes N-channel transistors 82 and 83 to be conductive. A current through N-channel transistor 83 is "mirrored" through N-channel transistor 82, causing match signal MTCH0 to be reduced to a logic low voltage through N-channel transistor 82 equal to approximately $V_{SS}$, indicating that differential input signals CD0 and CD0* are not the same logic state as differential data signals PEDP0 and PEDP0*.

Likewise, if differential input signals CD0 and CD0* are a logic high and a logic low, respectively, and differential data signals PEDP0 and PEDP0* are a logic low and a logic high, respectively, then P-channel transistors 73, 78, and 79 are conductive, and P-channel transistors 72, 76, and 77 are substantially non-conductive. A conductive path through P-channel transistors 73 and 79 causes N-channel transistors 82 and 83 to be conductive. A current through N-channel transistor 83 is "mirrored" through N-channel transistor 82, causing match signal MTCH0 to be reduced to a logic low voltage through N-channel transistor 82, indicating that differential input signals CD0 and CD0* are not the same logic state as differential data signals PEDP0 and PEDP0*.

Figure 3:
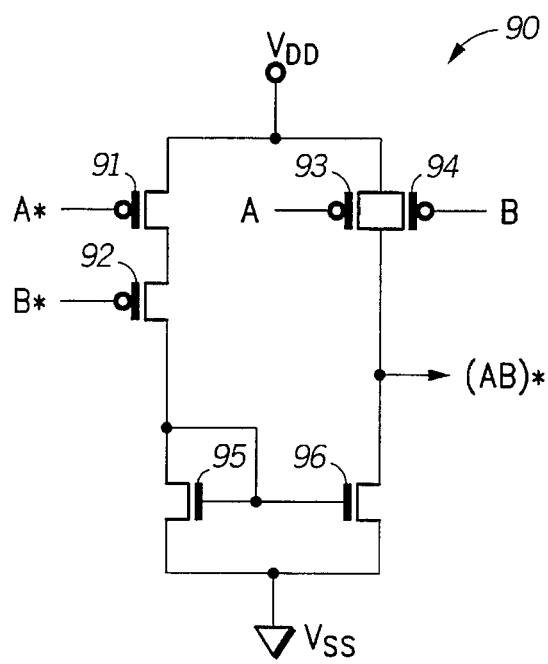
FIGS. 3–6 illustrate alternate embodiments of the combined level converter/logic circuit of FIG. 2.
Figure 4:
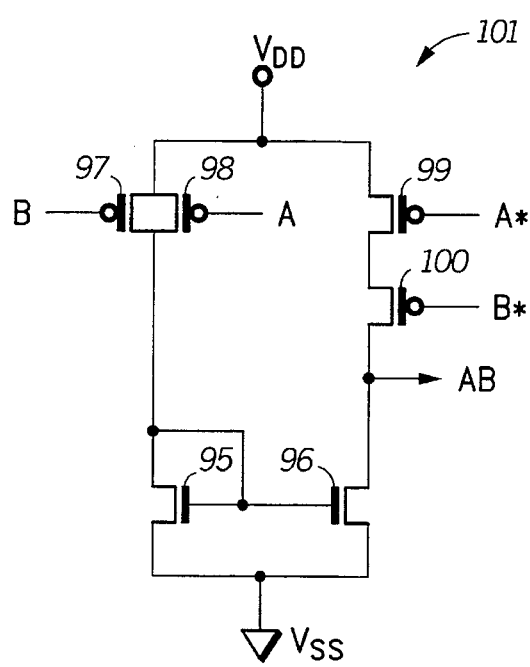

FIGS. 3–6 illustrate alternate embodiments of the combined level converter/comparator 37 of FIG. 2. Note that like elements of the various embodiments of FIGS. 3–6 have been given the same reference numbers. FIG. 3 illustrates combined level converter/logic circuit 90 for providing a NAND logic function. Combined level converter/logic circuit 90 of FIG. 3 includes P-channel transistors 91–94, and N-channel transistors 95 and 96. P-channel transistor 91 has a source (current electrode) connected to $V_{DD}$, a gate (control electrode) for receiving a first logic signal labeled "A*", and a drain (current electrode). P-channel transistor 92 has a source connected to the drain of P-channel transistor 91, a gate for receiving a logic signal labeled "B*", and a drain. P-channel transistors 93 and 94 are connected in parallel with their source terminals connected to $V_{DD}$, a gate of P-channel transistor 93 for receiving a logic signal labeled "A", a gate of P-channel transistor 94 for receiving a logic signal labeled "B", and their drains connected together for providing a logic signal labeled "(AB)*" representing the result of a NAND logic operation. N-channel transistor 95 has a drain and a gate connected to the drain of P-channel transistor 92, and a source connected to $V_{SS}$. N-channel transistor 96 has a drain connected to the drains of P-channel transistors 93 and 94, a gate connected to the gate of N-channel transistor 95, and a source connected to $V_{SS}$. N-channel transistors 95 and 96 are connected together to function as a current mirror.

Logic signals A and A* are differential logic signals having a first predetermined logic swing between first and second logic states, and logic signal B and B* are differential logic signals having a second predetermined logic swing between first and second logic states, where the first logic state may be a high voltage representing a logic "one", and the second logic state may be a low voltage representing a logic "zero". For example, the first predetermined logic swings may swing "rail-to-rail", where the high voltage may be the positive power supply voltage ($V_{DD}$) and the low voltage may be ground ($V_{SS}$). The second predetermined logic swing may be a relatively small signal swing, such as ECL (emitter-coupled logic), GTL (Gunning transceiver logic), etc., where the logic swing may be a volt or less.

Referring to FIG. 3, as an example, differential signals A and A* are CMOS level signals, where A is a logic high and A* is a logic low, and differential signals B and B* are relatively small signals, where B is a logic high and B* is a logic low. Combined level converter/logic circuit 90 provides a CMOS level output signal that is a logical NAND of differential signals A and A* with differential signals B and B*. P-channel transistors 91 and 92 are conductive, and P-channel transistors 93 and 94 are substantially non-conductive. N-channel transistor 95 is coupled to $V_{DD}$ through P-channel transistors 91 and 92, causing both N-channel transistors 95 and 96 to be conductive. Output signal (AB)* is pulled to a CMOS logic low through N-channel transistor 96.

Figure 5:
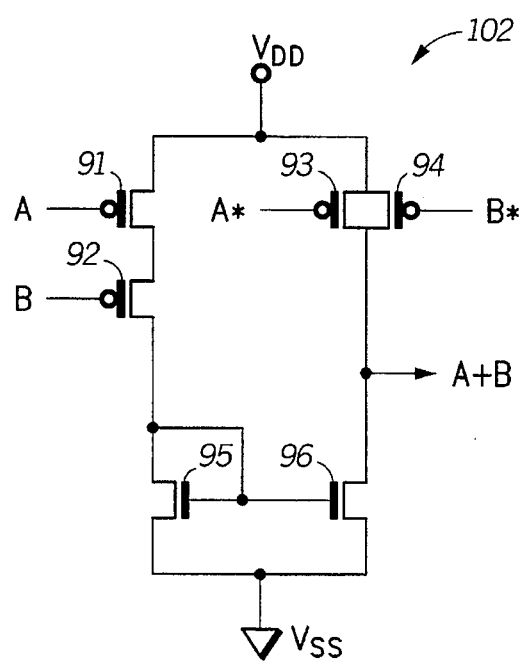
Figure 6:
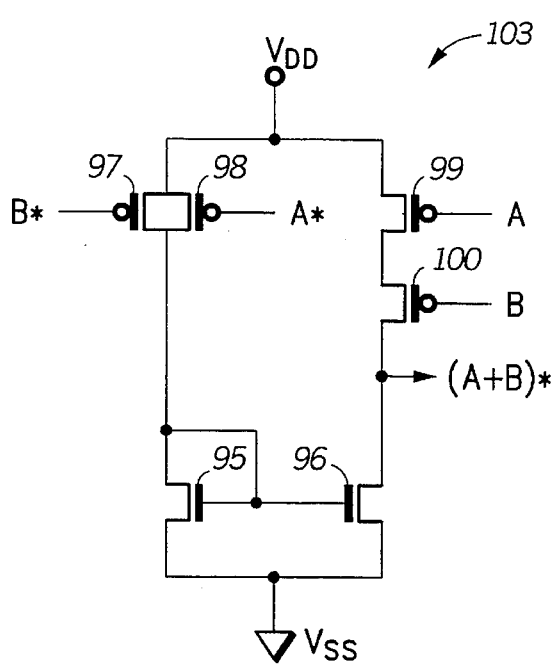

Combined level converter/logic circuit 102 of FIG. 5 is connected similarly to the combined level converter/logic circuit 90 of FIG. 3 to obtain an output signal that is a logical OR of differential signals A/A* and B/B*. Combined level converter/logic circuit 101 of FIG. 4 and combined level converter/logic circuit 103 of FIG. 6 are connected similarly to the combined level converters/logic circuits of FIGS. 3 and 5, except that the connections of the current mirror are reversed. Combined level converter/logic circuit 101 performs a logical AND operation and the combined level converter/logic circuit 103 performs a logical NOR operation. Note that in FIGS. 3–6, the first predetermined logic swing can be rail-to-rail, or anything less than rail-to-rail. Also, the second predetermined logic swing can be rail-to-rail, or anything less than rail-to-rail.

The combined level converters/logic circuits of FIGS. 3–6 may be useful in any application requiring a logical operation of two signals having different logic swings. The need for separate level converters and logic circuits is eliminated, reducing at least a gate delay in an integrated circuit incorporating the combined level converter/logic circuit of FIGS. 3–6, thus insuring faster generation of a level converted output logic signal.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

What is claimed is:

1. A cache TAG, comprising:

a plurality of memory cells;

a sense amplifier having first and second input terminals coupled to the plurality of memory cells for receiving first and second differential data bits from a selected memory cell, the sense amplifier having first and second output terminals for providing a first and second differential data signals having a relatively small logic swing corresponding to the first and second differential data bits;

a combined level converter/comparator having first and second input terminals coupled to the first and second output terminals of the sense amplifier for receiving the first and second differential data signals, first and second input terminals for receiving first and second differential input signals having a relatively large logic swing compared to the first and second differential data signals, the combined level converter/comparator for comparing the first and second differential data signals to the first and second differential input signals, and providing a match signal at a first logic state if the first and second differential data signals and the first and second differential input signals have the same logic state, and for providing the match signal at a second logic state if the first and second differential data signals and the first and second differential input signals have different logic states, and;

a level converter, the level converter having first and second input terminals for receiving the first and second differential data signals, respectively, and an output terminal for providing a level converted output data signal corresponding to the first and second differential data signals.

2. The cache TAG of claim 1, wherein the plurality of memory cells comprises an array of static random access memory cells.

3. The cache TAG of claim 1, wherein the sense amplifier comprises:

a differential amplifier, having first and second resistors, and first and second bipolar transistors, the first resistor being coupled between a first power supply voltage terminal and a collector of the first bipolar transistor, the second resistor being coupled between the first power supply voltage terminal and a collector of the second bipolar transistor;

a first emitter-follower transistor having a collector coupled to the first power supply voltage terminal, a base coupled to the first resistor, and an emitter for providing the first differential data signal; and a second emitter-follower transistor having a collector coupled to the first power supply voltage terminal, a base coupled to the second resistor, and an emitter for providing the second differential data signal, the second differential data signal being a logic complement of the first differential data signal.

4. The cache TAG of claim 1, wherein the combined level converter/comparator comprises:

a CMOS level switching portion for receiving the first and second differential input signals corresponding to the input signal; and a small signal switching portion, coupled to the CMOS level switching portion, having first and second input terminals for receiving the first and second differential data signals, respectively, the first and second differential data signals corresponding to the data signal, and having an output terminal for providing the match signal at substantially CMOS logic levels, wherein the match signal is a resultant of an exclusive NOR operation of the first and second differential input signals with the first and second differential data signals.

5. The cache TAG of claim 4, wherein the combined level converter/comparator comprises:

a first transistor having a first current electrode coupled to a first power supply voltage terminal, a control electrode for receiving the first differential input signal, and a second current electrode;

a second transistor having a first current electrode coupled to the first power supply voltage terminal, a control electrode for receiving the second differential input signal, and a second current electrode;

a third transistor having a first current electrode coupled to the second current electrode of the first transistor, a control electrode for receiving the first differential data signal, and a second current electrode;

a fourth transistor having a first current electrode coupled to the second current electrode of the third transistor, a control electrode, and a second current electrode coupled to a second power supply voltage terminal;

a fifth transistor having a first current electrode coupled to the second current electrode of the first transistor, a control electrode for receiving the second differential data signal, and a second current electrode coupled to the control electrode of the fourth transistor;

a sixth transistor having a first current electrode coupled to the second current electrode of the second transistor, a control electrode for receiving the second differential data signal, and a second current electrode coupled to the first current electrode of the fourth transistor;

a seventh transistor having a first current electrode coupled to the second current electrode of the second transistor, a control electrode for receiving the first differential data signal, and a second current electrode coupled to the control electrode of the fourth transistor; and an eighth transistor having a first current electrode and a control electrode coupled to the control electrode of the fourth transistor, and a second current electrode coupled to the second power supply voltage terminal.

6. The cache TAG of claim 1, wherein the level converter comprises:

a first transistor having a first current electrode coupled to a first power supply voltage terminal, a control electrode for receiving the first differential data signal, and a second current electrode for providing the level converted output data signal;

a second transistor having a first current electrode coupled to the first power supply voltage terminal, a control electrode for receiving the second differential data signal, and a second current electrode;

a third transistor having a first current electrode coupled to the second current electrode of the first transistor, a control electrode, and a second current electrode coupled to a second power supply voltage terminal; and a fourth transistor having a first current electrode and a control electrode coupled to the second current electrode of the second transistor, and a second current electrode coupled to the second power supply voltage terminal.

7. A circuit having a combined level conversion and logic function, comprising:

a CMOS level switching portion having first and second input terminals for receiving first and second differential input signals, respectively, the first and second differential input signals having a first predetermined logic swing; and a small signal switching portion, coupled to the CMOS level switching portion, having first and second input terminals for receiving third and fourth differential input signals, respectively, the third and fourth differential input signals having a second predetermined logic swing, the small signal switching portion having an output terminal for providing an output signal at substantially the first predetermined logic swing, wherein the output signal is a resultant of a logical operation of the first and second differential input signals with the third and fourth differential input signals;

wherein the circuit comprises:

a first transistor having a first current electrode coupled to a first power supply voltage terminal, a control electrode for receiving the differential input signal, and a second current electrode;

a second transistor having a first current electrode coupled to the first power supply voltage terminal, a control electrode for receiving the third differential input signal, and a second current electrode coupled to the second current electrode of the first transistor;

a third transistor having a first current electrode coupled to the first power supply voltage terminal, a control electrode for receiving the second differential input signal, and a second current electrode;

a fourth transistor having a first current electrode coupled to the second current electrode of the third transistor, a control electrode for receiving the fourth differential input signal, and a second current electrode;

a fifth transistor having both a first current electrode and a control electrode coupled to the second current electrode of the fourth transistor, and a second current electrode coupled to a second power supply voltage terminal; and a sixth transistor having a first current electrode coupled to the second current electrode of the second transistor, a control electrode coupled to the control electrode of the fifth transistor, and a second current electrode coupled to the second power supply voltage terminal.

8. The circuit of claim 7, wherein the circuit comprises:

a first transistor having a first current electrode coupled to a first power supply voltage terminal, a control electrode for receiving the first differential input signal, and a second current electrode;

a second transistor having a first current electrode coupled to the first power supply voltage terminal, a control electrode for receiving the second differential input signal, and a second current electrode;

a third transistor having a first current electrode coupled to the second current electrode of the first transistor, a control electrode for receiving the third differential input signal, and a second current electrode;

a fourth transistor having a first current electrode coupled to the second current electrode of the third transistor, a control electrode, and a second current electrode coupled to a second power supply voltage terminal;

a fifth transistor having a first current electrode coupled to the second current electrode of the first transistor, a control electrode for receiving the fourth differential input signal, and a second current electrode coupled to the control electrode of the fourth transistor;

a sixth transistor having a first current electrode coupled to the second current electrode of the second transistor, a control electrode for receiving the third differential input signal, and a second current electrode coupled to the control electrode of the fourth transistor;

a seventh transistor having a first current electrode coupled to the second current electrode of the second transistor, a control electrode for receiving the fourth differential input signal, and a second current electrode coupled to the first current electrode of the fourth transistor; and an eighth transistor having a first current electrode and a control electrode coupled to the control electrode of the fourth transistor, and a second current electrode coupled to the second power supply voltage terminal.

9. The circuit of claim 7, wherein the circuit comprises:

a first transistor having a first current electrode coupled to a first power supply voltage terminal, a control electrode for receiving the first differential input signal, and a second current electrode;

a second transistor having a first current electrode coupled to the first power supply voltage terminal, a control electrode for receiving the third differential input signal, and a second current electrode coupled to the second current electrode of the first transistor;

a third transistor having a first current electrode coupled to the first power supply voltage terminal, a control electrode for receiving the second differential input signal, and a second current electrode;

a fourth transistor having a first current electrode coupled to the second current electrode of the third transistor, a control electrode for receiving the fourth differential input signal, and a second current electrode;

a fifth transistor having both a first current electrode and a control electrode coupled to the second current electrodes of the first and second transistors, and a second current electrode coupled to a second power supply voltage terminal; and a sixth transistor having a first current electrode coupled to the second current electrode of the fourth transistor, a control electrode coupled to the control electrode of the fifth transistor, and a second current electrode coupled to the second power supply voltage terminal.

10. The circuit of claim 7, wherein the first predetermined logic swing is substantially a CMOS level logic swing, and the second predetermined logic swing is less than the first predetermined logic swing.

11. The circuit of claim 7, wherein the circuit is for comparing an input signal to a data signal in a cache TAG, and in response, providing a match signal when both the input signal and the data signal are the same logic state.

12. The circuit of claim 7, wherein the logical operation is selected from a group consisting of a logical NAND operation, a logical NOR operation, a logical OR operation, and a logical AND operation.

13. A cache TAG, comprising:

a plurality of memory cells;

a plurality of sense amplifiers, coupled to the plurality of memory cells, the plurality of sense amplifiers for receiving a plurality of differential data bits from selected memory cells of the plurality of memory cells, the plurality of sense amplifiers for providing a plurality of differential data signals having a first predetermined logic swing, a differential data signal of the plurality of differential data signals corresponding to one of the plurality of differential data bits;

a plurality of combined level converters/comparators, each of the plurality of combined level converters/comparators having first and second differential input terminals coupled to first and second differential output terminals of one of the plurality of sense amplifiers for receiving a corresponding one of the plurality of differential data signals, third and fourth differential input terminals for receiving a differential input signal of a plurality of differential input signals, the differential input signal having a second predetermined logic swing, each of the plurality of combined level converters/comparators for comparing the corresponding differential data signals to one of the plurality of differential input signals, and providing a match signal at a first logic state if the corresponding differential data signal and the differential input signal have the same logic state, and for providing the match signal at a second logic state if the differential data signal and the differential input signal have different logic states;

a summation circuit, coupled to the plurality of combined level converters/comparators, for receiving the match signal from each of the plurality of combined level converters/comparators, and in response, providing a match summation signal indicating whether or not requested data is located in the plurality of memory cells; and a plurality of level converters coupled to the plurality of sense amplifiers, the plurality of level converters for receiving the plurality of differential data signals, and in response, providing a plurality of differential level converted output data signals.

14. The cache TAG of claim 13, wherein the plurality of memory cells comprises a plurality of static random access memory cells.

15. The cache TAG of claim 13, wherein each of the plurality of combined level converters/comparators comprises:

a CMOS level switching portion having first and second input terminals for receiving first and second differential input signals, respectively, the first and second differential input signals corresponding to the one of the plurality of data bits, the first and second differential input signals having the second predetermined logic swing; and a small signal switching portion, coupled to the CMOS level switching portion, having first and second input terminals for receiving first and second differential data signals, respectively, one of the first and second differential data signals corresponding to one of the plurality of data signals, the first and second differential data signals having the first predetermined logic swing, the small signal switching portion having an output terminal for providing a differential output signal at substantially the second predetermined logic swing, wherein the differential output signal is a result of an exclusive NOR operation of the first and second differential input signals with the first and second differential data signals.

16. The cache TAG of claim 15 wherein one of the plurality of combined level converters/comparators comprises:

a first transistor having a first current electrode coupled to a first power supply voltage terminal, a control electrode for receiving the first differential input signal, and a second current electrode;

a second transistor having a first current electrode coupled to the first power supply voltage terminal, a control electrode for receiving the second differential input signal, and a second current electrode;

a third transistor having a first current electrode coupled to the second current electrode of the first transistor, a control electrode for receiving the first differential data signal, and a second current electrode;

a fourth transistor having a first current electrode coupled to the second current electrode of the third transistor, a control electrode, and a second current electrode coupled to a second power supply voltage terminal;

a fifth transistor having a first current electrode coupled to the second current electrode of the first transistor, a control electrode for receiving the second differential data signal, and a second current electrode coupled to the control electrode of the fourth transistor;

a sixth transistor having a first current electrode coupled to the second current electrode of the second transistor, a control electrode for receiving the second differential data signal, and a second current electrode coupled to the first current electrode of the fourth transistor;

a seventh transistor having a first current electrode coupled to the second current electrode of the second transistor, a control electrode for receiving the first differential data signal, and a second current electrode coupled to the control electrode of the fourth transistor; and an eighth transistor having a first current electrode and a control electrode coupled to the control electrode of the fourth transistor, and a second current electrode coupled to the second power supply voltage terminal.

17. The cache TAG of claim 13, wherein each of the plurality of level converters comprises:

a first transistor having a first current electrode coupled to a first power supply voltage terminal, a control electrode for receiving the first differential data signal, and a second current electrode for providing the output data signal;

a second transistor having a first current electrode coupled to the first power supply voltage terminal, a control electrode for receiving the second differential data signal, and a second current electrode;

a third transistor having a first current electrode coupled to the second current electrode of the first transistor, a control electrode, and a second current electrode coupled to a second power supply voltage terminal; and a fourth transistor having a first current electrode and a control electrode coupled to the second current electrode of the second transistor, and a second current electrode coupled to the second power supply voltage terminal.

18. The cache TAG of claim 13, wherein each of the plurality of sense amplifiers comprises:

a differential amplifier, having first and second resistors, and first and second bipolar transistors, the first resistor being coupled between a first power supply voltage terminal and a collector of the first bipolar transistor, the second resistor being coupled between the first power supply voltage terminal and a collector of the second bipolar transistor;

a first emitter-follower transistor having a collector coupled to the first power supply voltage terminal, a base coupled to the first resistor, and an emitter for providing a first differential data signal corresponding to the data signal; and a second emitter-follower transistor having a collector coupled to the first power supply voltage terminal, a base coupled to the second resistor, and an emitter for providing a second differential data signal, the second differential data signal being a logic complement of the first differential data signal.

19. The cache TAG of claim 13, wherein the summation circuit includes a logical NOR operation.

* * * * *